United States Patent [19]

Shinriki et al.

[11] Patent Number: 5,679,974
[45] Date of Patent: Oct. 21, 1997

[54] ANTIFUSE ELEMENT AND SEMICONDUCTOR DEVICE HAVING ANTIFUSE ELEMENTS

[75] Inventors: Hiroshi Shinriki; Yoshimitsu Tamura; Tomohiro Ohta, all of Chiba, Japan

[73] Assignee: Kawasaki Steel Corporation, Hyogo-ken, Japan

[21] Appl. No.: 353,287

[22] Filed: Dec. 5, 1994

[30] Foreign Application Priority Data

Sep. 29, 1994 [JP] Japan ................................. 6-235059

[51] Int. Cl.$^6$ ............................. H01L 29/00; H01L 29/04
[52] U.S. Cl. ........................... 257/530; 257/50; 257/52
[58] Field of Search .................... 257/50, 529, 52, 257/209, 528, 530

[56] References Cited

U.S. PATENT DOCUMENTS 4,488,262  12/1984  Basire et al. .
5,521,423  5/1996  Shinriki et al. ................ 257/530

OTHER PUBLICATIONS

"Scaled Dielectric Antifuse Structure For Field-Programmable Gate Array Applications", IEEE Electron Device Letters, vol. 12, No. 4, Apr. 1993, pp. 151–153.

"A Highly Reliable Metal-to-Metal Antifuse For High-Speed Field Programmable Gate Arrays", IEEE, IEDM Tech. Dig. (1993) pp. 31–34.

Babcock et al., "Ti–W contacts to Si", J. App.l Phys. 53(10), American Institute of Pysics, Oct. 1982, pp. 6898–6905.

*Primary Examiner*—Mahshid D. Saadat
*Assistant Examiner*—Valencia Martin Wallace
*Attorney, Agent, or Firm*—Oliff & Berridge

[57] ABSTRACT

An antifuse element for a semiconductor device, comprising a bottom electrode made from a conductive material containing a refractory metal and a top electrode made from a conductive material containing a fusible metal. The fusible metal is Al, Al alloy, Cu or Ag. The Al alloy contains at least Si, Cu, Sc, Pd, Ti, Ta or Nb. The refractory metal is Ti, Zr, Hf, V, Nb, Ta, Cr, Mo or W. Silicides are most preferable as the refractory metal. The semiconductor device is programmed by making the top electrode negative or positive and by applying a breakdown voltage between the bottom and top electrodes so as to break down an antifuse material layer, thereby obtaining a filament. The filament is made from the fusible metal from the top electrode and the refractory metal from the bottom electrode. Thus, the filament has a low resistance, and a good EM resistance.

22 Claims, 8 Drawing Sheets

ANTIFUSE ELEMENT AND SEMICONDUCTOR DEVICE HAVING ANTIFUSE ELEMENTS

BACKGROUND OF THE INVENTION

1. Field of the Invention

This invention relates to an antifuse element and a semiconductor device having antifuse elements. Such a semiconductor device is applicable to a field-programmable gate array (referred to as "FPGA" hereinafter), a programmable read only memory (referred to as "PROM" hereinafter), or the like.

2. Description of the Prior Art

Antifuse elements are often used for a semiconductor device applicable to user programmable gate arrays such as FPGAs, PROMs or the like. Such an antifuse element is described in IEEE, Electron Device Letter, Vol. 13, No. 9, September, 1992, pp. 488–490, and IEEE Transactions on Electron Devices, Vol. 41, No. 5, May 1994, pp. 711–725.

In the antifuse element, an antifuse material layer is positioned between bottom and top electrodes. When the antifuse material layer is broken down, a filament is formed to electrically connect the bottom and top electrodes. A relatively high breakdown voltage is used to break down the antifuse material layer. In an FPGA, the bottom and top electrodes of the antifuse elements are selectively made conductive or left non-conductive after a semiconductor device is fabricated, so that the circuits can be programmed as desired. The same holds true for the PROM, i.e. data can be written as desired thereinto.

Such antifuse elements are prone to problems as described hereinafter. In the antifuse elements described in the foregoing documents, surfaces of the bottom and top electrodes which are in direct contact with the antifuse material layer are made from aluminum (Al) alloy. When the antifuse material layer is broken down, a filament is formed between the top and bottom electrodes. The filament is made from a compound which is mainly of Al diffusing and migrating from these electrodes. Such a filament can have a reduced resistance. However, if an operating voltage is applied to the filament for a long period of time, the filament might be broken down due to electron-migration (EM). This would lead to a problem that the semiconductor device including the antifuse elements might become less reliable in its operation and have a short life.

SUMMARY OF THE INVENTION

The present invention is contemplated so as to overcome the foregoing problems of the prior art. It is therefore a first object of the invention to provide an antifuse element which, when programmed, produces a filament having a reduced electrical resistance and has a good resistance to EM.

A second object of the invention is to accelerate an operation speed of a semiconductor device including the foregoing antifuse elements and to assure reliable operation of the device for a long period of time.

A third object of the invention is to enable the filament to have a uniform resistance and to improve the reliability of the semiconductor device.

According to a first aspect of the invention, there is provided an antifuse element for a semiconductor device. The antifuse element comprises bottom and top electrodes and an antifuse material layer interposed between these electrodes.

In the antifuse element, at least an uppermost layer of the bottom electrode is made from a conductive material containing a refractory metal, and at least a lowermost layer of the top electrode is made from a conductive material containing a fusible metal and having a lower resistance than the resistance of the refractory metal. The fusible metal may be Al, aluminum (Al) alloy, Cu, or Ag. When the Al alloy is used, it may contain at least Si, Cu, Sc, Pd, Ti, Ta or Nb. The refractory metal may be Ti, Zr, Hf, V, Nb, Ta, Cr, Mo, or W. Especially, the uppermost layer of the bottom electrode is made from a silicide which is formed by the combination of Si with any of the foregoing refractory metals.

When the antifuse is programmed, a filament is formed as a compound mainly comprising any of the foregoing fusible metals and any of the refractory metals. Such a compound is $TiAl_3$, $ZrAl_3$, $HfAl_3$, $VAl_3$, $NbAl_3$, $TaAl_3$, $CrAl_7$, $MoAl_{12}$, or $WAl_{12}$.

In the first aspect, at least the lowermost layer of the top electrode, which is most adjacent to the antifuse material layer, is made from a conductive material containing a fusible metal such as aluminum. Further, at least the uppermost layer of the bottom electrode, which is nearest to the antifuse material layer, is made from a conductive material containing a refractory metal. When the antifuse material layer is broken down so as to form a filament for electrically connecting the bottom and top electrodes, the fusible and refractory metals migrate into the filament from the bottom and top electrodes. In other words, the filament is made from a compound of the fusible and refractory metals. Thus, the filament itself can improve its resistance to electron-migration.

In a second aspect of the invention, a barrier metal is disposed in a space between the top electrode and a metal interconnect over the top electrode so as to prevent diffusion of the fusible metal. Such a barrier metal is made from Ti, Ta, Zr, Hf, V, Nb, Mo, W or Pt, a nitride or silicide of Ti, Ta, Zr, Hf, V, Nb, Mo, W or Pt, or TiW.

In a third aspect of the invention, the top electrode or at least a lowermost layer of the top electrode is thicker than the antifuse material layer, and the top electrode is thinner than the metal interconnect layer over the top electrode, or is half or less of an effective diameter of an antifuse opening for electrically connecting said bottom and top electrodes.

In this arrangement, since the top electrode is substantially flat and smooth, it can make the underside of the metal interconnect very smooth (i.e. an inter-metal dielectric layer is substantially free from stepped portions). Step coverage at the metal interconnect can be improved. Further, the top electrode and the antifuse material layer are patterned by lithography and etching techniques. An etching mask is precisely formed by the lithography so as to have a uniform thickness. In addition, the top electrode or the lowermost layer of the top electrode is generated in the antifuse opening without making any void therein. Thus, it is possible to prevent poor connection of a filament, and assure reliable electrical connection.

According to a fourth aspect, the bottom electrode or at least the uppermost layer of the bottom electrode is made from amorphous material or a crystalline material having a grain size of 20 nm or less.

When the amorphous material is used, the surface of the bottom electrode is free from grain boundaries, and is substantially free from sharp protrusions, and is extensively smoothed. Thus, the antifuse material layer lying on the bottom electrode can reduce defects caused by such sharp protrusions and assure good quality thereof. This means that the antifuse material layer can assure reliable long life. On the other hand, when the crystalline material is used, the grain size of the surface of the bottom electrode is so minute that sharp protrusions can be reduced and make the bottom electrode very smooth on the surface.

In a fifth aspect, the bottom and top electrodes are adapted to receive a positive potential and a negative potential, respectively, so as to form a filament containing a fusible metal from the top electrode or from a lowermost layer of the top electrode. Further, the bottom and top electrodes are adapted to receive a positive potential and a negative potential, respectively, so as to form a filament containing a fusible metal from the top electrode or from a lowermost layer of the top electrode and a refractory metal the said bottom electrode or an uppermost layer of the bottom electrode.

With the foregoing arrangement, the fusible metal in the top electrode performs electron-migration, thereby forming a filament containing a single crystal fusible metal. Such a filament is slow to break down and has a low resistance. Further, since the filament contains a refractory metal of the bottom electrode, it has a good resistance to EM.

According to a sixth aspect, an oxide or nitride film is stripped from a surface of the bottom electrode, a part of the surface of the bottom electrode is removed to a certain depth at an area associated with a conductive material containing a refractory metal, and a new oxide film is formed thereon, so that an antifuse material layer is formed on the bottom electrode. A wet chemical pre-cleaning process using hydrogen peroxide solution ($H_2O_2$) or ammonia hydrogen peroxide solution ($NH_4OH$) is adopted for removing a part of the bottom electrode and forming a new oxide film.

In this arrangement, the oxide film having poor quality or a nitride film having sharp protrusions is stripped off from the bottom electrode, thereby smoothing the surface of the bottom electrode. Further, a part of the surface of the bottom electrode is removed to promote smoothness thereof. Especially, the wet chemical pre-cleaning by using hydrogen peroxide solution or ammonia hydrogen peroxide solution effectively strips off a part of the surface of the bottom electrode, so that a good fresh oxide film can be formed on the surface of the bottom electrode, which produces an antifuse material layer of good quality with a reduced number of defects.

DESCRIPTION OF PREFERRED EMBODIMENTS

Figure 1A:
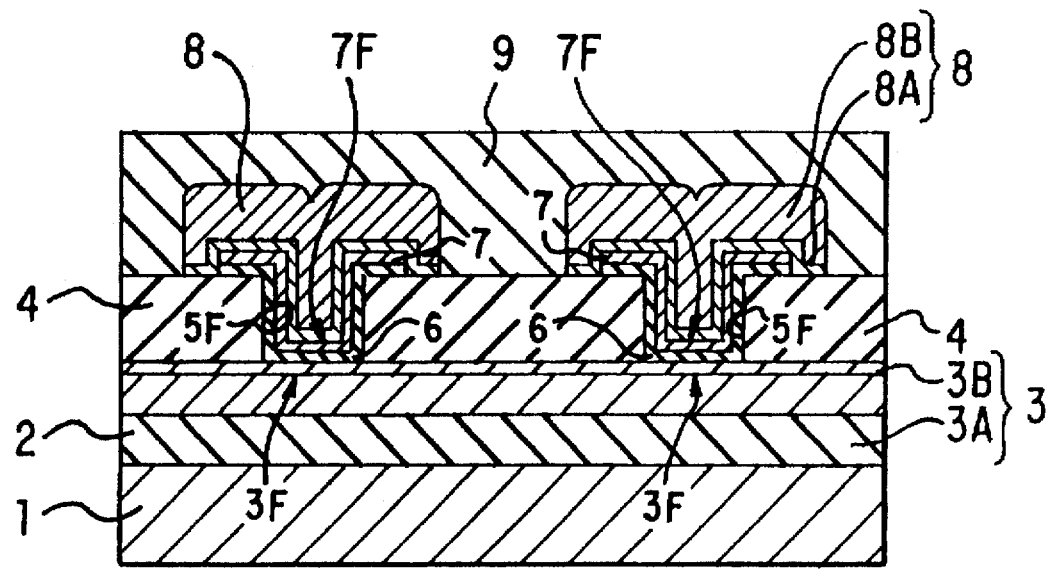
FIG. 1A is a cross-sectional view showing an antifuse element prior to programming, according to a first embodiment of the invention.

An antifuse element shown in FIG. 1A is used for an integrated circuit device formed within and on a substrate to mount an FPGA or PROM thereon.

Referring to FIG. 1A, the antifuse element includes a metal interconnect layer on the substrate 1. The substrate 1 is a single crystal silicon substrate, and mounts thereon semiconductor elements such as metal insulator semiconductor field effect transistors (MISFET) constituting an FPGA or PROM, not shown.

Figure 1B:
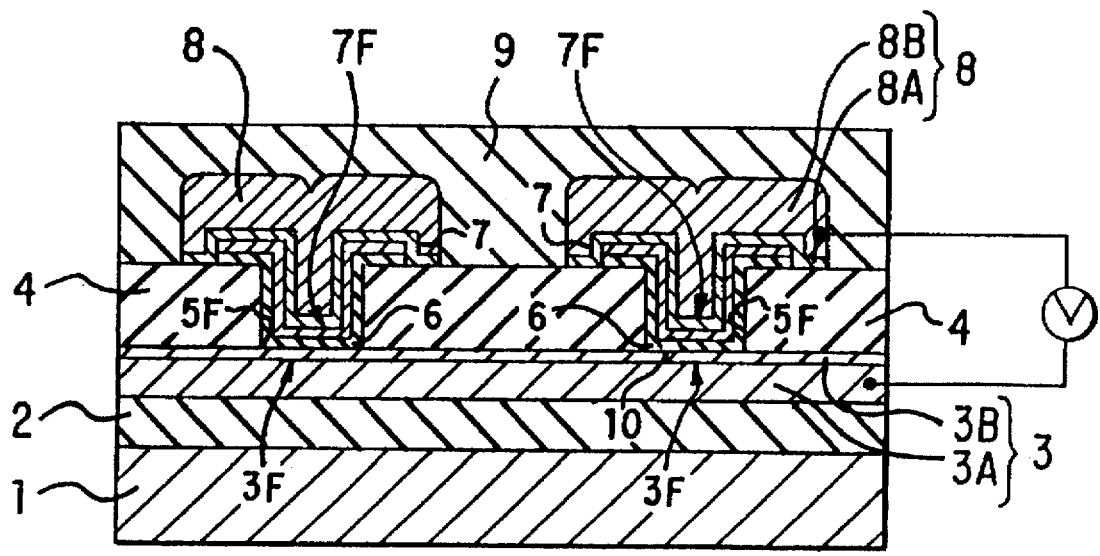
FIG. 1B is a view similar to FIG. 1A, but showing a programmed antifuse element.

The metal interconnect layer includes a first level (lower) metal interconnect 3 and a second level metal interconnect 7 lying on the first level metal interconnect 3. The first level metal interconnect 3 is located on an inter-metal dielectric layer 2 covering the semiconductor elements. In FIGS. 1A and 1B, the first level metal interconnect 3 extends from left to right in the plane of these drawing figures. The second level metal interconnect 7 is formed on an inter-metal dielectric layer 4 covering the first level metal interconnect 3. The second level metal interconnect 7 includes a third level metal interconnect 8. In FIGS. 1A and 1B, the third level metal interconnect 8 is arranged in a direction intersecting the first level metal interconnect 3, i.e. from left to right. The third metal interconnect 8 extends perpendicularly to the plane shown by these drawing figures. The first and third level metal interconnects 3 and 8 are electrically connected via through-holes 5 on the inter-metal dielectric layer 4. These metal interconnects 3 and 8 are used for connecting circuits such as logical circuits.

A plurality of antifuse elements are incorporated in the metal interconnect layer and are used to connect circuits selectively. Each of the antifuse elements includes a bottom electrode 3F, an antifuse material layer 6, and a top electrode 7F. In this embodiment, the bottom electrode 3F is a part of the first level metal interconnect 3, and is fabricated simultaneously with the first level metal interconnect 3. The top electrode 7F is sandwiched between the first and second level metal interconnects 3 and 7, and is formed separately from the first and third level metal interconnects 3 and 8. The antifuse material layer 6 is formed at least in an antifuse opening 5F between the bottom and top electrodes 3F and 7F.

In each antifuse element, the bottom electrode 3F, i.e. at least an uppermost layer 3B thereof, is made from a conductive material containing a refractory metal. In this embodiment, the uppermost layer 3B can be made from Ti, Zr, Hf, V, Nb, Ta, Cr, Mo, or W. Specifically, the uppermost layer 3B may be of a silicide which is made from one of the foregoing refractory metals, and silicon (Si).

The top electrode 7F, or at least a lowermost layer thereof which is in contact with the antifuse material layer 6, is made from a conductive material containing a fusible metal. In this embodiment, Al, Al alloy, Cu or Ag can be used as the fusible metal. When the Al alloy is used, it contains Si, Cu, Sc, Pd, Ti, Ta, or Nb as an additive. An alloy of Al-Si, Al-Cu, Al-Sc, Al-Si-Cu, Al-Si-Pd, or Al-Cu-Ti is usable as the top electrode 7F. The alloy of Al-Si contains 1.0 Wt % Si. The alloy of As-Sc contains 0.15 wt % Sc. The alloy of Al-Si-Cu contains 1.0 wt % Si and 0.5–0.40 wt % Cu. The alloy of Al-Si-Pd contains 1.0 wt % Si and 0.3 wt % Pd. The alloy of Al-Cu-Ti contains 0.1 wt % Cu and 0.15 wt % Ti. Ta and Nb as an additive are as effective as Ti. In the alloys of Al, the ratio of the additive is in a range which does not raise a conductor resistance, e.g. 5 wt % at maximum. When a slight increase in the conductor resistance is acceptable, additives such as Ti, Ta and Nb may occupy 50 wt % of the alloys at maximum.

Referring to FIG. 1A, the antifuse material layer 6 is present between the bottom and top electrodes 3F and 7F, so that these electrodes remain non-conductive, i.e. no current flows therebetween. This means that the FPGA is not programmed, or the PROM remains unloaded with data.

FIG. 1B shows that the antifuse material layer 6 associated with an antifuse element (shown on the right side) is broken down and a filament 10 is formed between the bottom and top electrodes 7F and 3F. In other words, the FPGA has been programmed, or the PROM is loaded with data.

With this antifuse element, the fusible metal migrates into the filament 10 from the top electrode 7F. Since this fusible metal has a resistance which is typically several orders of magnitude lower than Si used as a gate material, a resistance value of the filament 10 can be reduced.

In principle, the present invention is characterized in that the top electrode 7F containing the fusible metal is located on the antifuse material layer 6, and that a compound containing a refractory metal is positioned just under the antifuse material layer 6. In other words, when the antifuse material layer 6 is broken down so as to conduct a current between the bottom and top electrodes 3F and 7F, the refractory metal diffuses and electron-migrates into the filament 10. Further, the current flowing through the filament 10 generates Joule heat, which melts the fusible metal in the top electrode 7F. The melted fusible metal also migrates into the filament 10. However, in this state, the refractory metal or the compound containing the refractory metal which is just under the fusible metal is not melted because of the low Joule heat.

Therefore, when the refractory metal diffuses and electron-migrates to come into contact with the melted fusible metal, a compound whose fusing point is intermediate between the high and low fusing points will be generated. This compound constitutes the filament 10.

Al (having the melting point of 660° C.) is the most promising as the fusible metal. Further, either Cu or Ag is also usable as the fusible metal although its fusing point is somewhat higher than the fusing point of Al. Any conductive materials can be used as the fusible metal so long as they have a fusing point which is equal to or lower than the fusing point of Al, Cu or Ag (i.e. Cu has the highest fusing point, 1,080° C., of the three). For instance, a compound such as NiSi (whose fusing point is approximately 1,000° C.) is usable as the top electrode 7F or the lowermost layer of the top electrode 7F. A compound containing not only a fusible metal but also a refractory metal, such as an Al-Ti alloy, is usable as the fusible metal so long as the compound contains a fusible metal.

The refractory metal may be W, Ta, Ti, Zr, Nb, or Mo (i.e. Ti has the fusing point of 1,680° C., which is the lowest of these metals). As described above, the refractory metal may be silicides which are formed by the combination of Si with nitride of any of the foregoing refractory metal or the combination of Si with any of the refractory metals. (TiSi has a fusing point of approximately 1,550° C., which is the lowest of the silicides.)

In this embodiment, the filament 10 is made from Al or a compound made from Al and one of the foregoing refractory metals. Such a compound is $TiAl_3$, $ZrAl_3$, $HfAl_3$, $VAl_3$, $NbAl_3$, $TaAl_3$, $CrAl_7$, $MoAl_{12}$, or $WAl_{12}$.

A final passivation film 9 is formed on the third level metal interconnect 8 shown in FIGS. 1A and 1B.

A method of forming the antifuse element, and particularly a method of forming the metal interconnects, will be described with reference to FIGS. 2A to 2(E), which are cross-sectional views of the antifuse element showing progressive steps in the formation of the metal interconnects in respective steps.

Figure 2A:
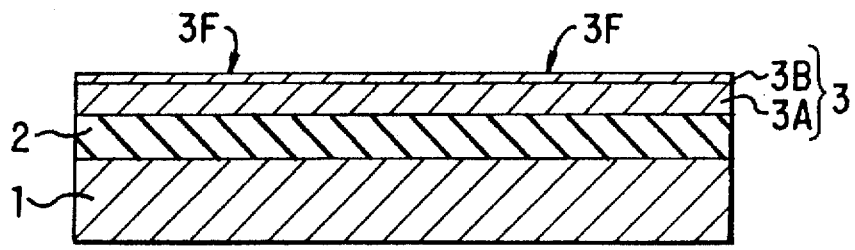
FIG. 2A to FIG. 2E are cross-sectional views showing progressive steps in the formation of the antifuse element shown in FIGS. 1A and 1B.
Figure 2B:
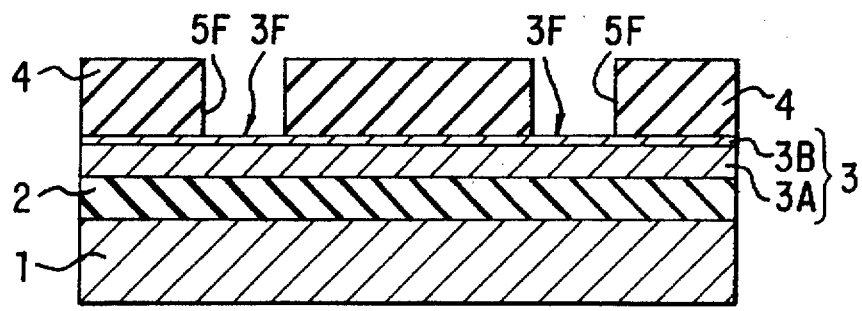
Figure 2C:
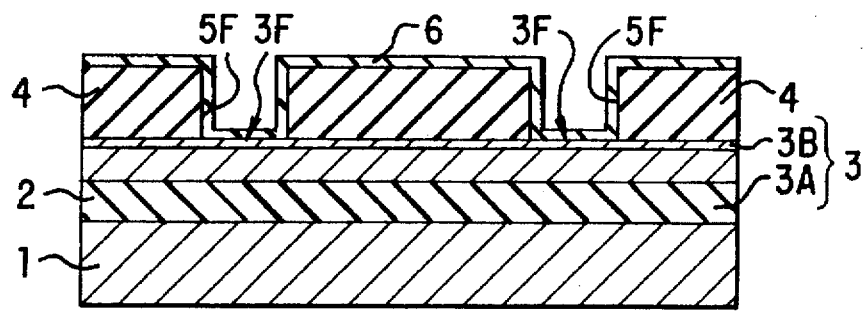

Referring to FIG. 2A, the first level metal interconnect 3 is laid on the inter-metal dielectric layer 2, and the bottom electrode 3F is formed by using a part of the first level metal interconnect 3 in the same fabricating process. In this embodiment, the first level metal interconnect 3 and the bottom electrode 3F are made from an aluminum alloy film 3A and a tungsten silicide ($WSi_x$) film 3B formed over the aluminum alloy film 3A.

The aluminum alloy film 3A is made from aluminum alloy containing Cu or Si as an additive, and is formed by sputtering (or vacuum evaporation). The aluminum alloy film 3A is 800 to 1000 nm thick, for example.

The tungsten silicide film 3B is amorphous in this embodiment, and is formed by sputtering, which is carried out in an Ar gas and at a substrate temperature of 450° C. or less. Specifically, the tungsten silicide film 3B is formed at a temperature of 450° C. which is below a temperature where the film 3B is thermally crystallized, and is not subject to any special thermal treatment so as to promote crystallization of this film in the succeeding steps. In other words, the film 3B is formed by the low temperature process. In this embodiment, $W_{1.0}Si_{1.8}$ is used as a target. Further, $W_xSi_y$ (where x=1.0, and y=1.0–2.5) is also usable as a target. The inventor(s) has (have) found that such targets are useful to obtain an amorphus material. The tungsten silicide film 3B is 50 nm to 200 nm thick (e.g. 50 nm thick in this embodiment).

The foregoing tungsten silicide film 3B is free from grain boundaries, which means that the film 3B is extensively smoothed because of absence of surface roughness or sharp protrusions caused by crystal grains. Therefore, the antifuse material layer 6 will be formed on the tungsten silicide film 3B with fewer defects per unit area in a succeeding step. Even if the tungsten silicide film 3B is crystallized to have a crystal grain size of 20 nm or less, it can assure as a good and reliable insulation resistance of the antifuse material layer 6 of an unprogrammed antifuse as when the tungsten silicide film 6 is amorphous.

In a second step, the inter-metal dielectric layer 4 is formed over the substrate including the first level metal interconnect 3 and the bottom electrode 3F. The through-hole 5 (not shown) and antifuse openings 5F are made on the inter-metal dielectric layer 4 at desired positions associated with first level metal interconnect 3 concurrently with the formation of the inter-metal dielectric layer 4 (refer to FIG. 2B). The inter-metal dielectric layer 4 is an oxide silicon film which is 1.0 μm thick. The antifuse opening 5F is made by photolithgraphy and etching, and is 1.0 μm in diameter.

In a third step, the bottom electrode 3F, i.e. the surface of the tungsten silicide film 3B, is subject to wet chemical pre-cleaning so as to strip off at least an oxide or nitride film from the surface of the tungsten silicide film 3B and to etch a part of the surface of the film 3B to a certain depth. The oxide or nitride film is formed on the film 3B when the film 3B is exposed to the air while the film 3B is being formed. In this embodiment, ammonium hydrogen peroxide ($NH_4OH:H_2O_2:H_2O=1:1:5$, 70° C.) is used for 5-minute pre-cleaning, for example. After the wet chemical pre-cleaning, the tungsten silicide film 3B is free from the oxide degrading the quality thereof and nitride causing surface roughness, respectively. Further, the surface of the tungsten silicide film 3B is partially etched so as to be further smoothed. A fresh and good oxide film is naturally formed on the smoothed surface of the tungsten silicide film 3B, and serves as a part of the antifuse material layer 6. This oxide film has excellent quality.

The wet chemical pre-cleaning is executed at a solution temperature of 70° C. and for five minutes. Thus, the tungsten silicide film 3B is etched to a depth of approximately 5 to 10 nm. Since a speed of the etching in the wet chemical pre-cleaning is very low, it is possible to precisely control a depth of the film surface to be etched. Therefore, the tungsten silicide film 3B can have a sufficient thickness, i.e. approximately 40 nm, after the wet chemical pre-cleaning.

Alternatively, dry chemical pre-cleaning may be utilized so long as it is as effective as the wet chemical pre-cleaning. Specifically, an isotropic chemical dry etching process is applied by using a fluoride-based gas. The isotropic chemical dry etching process is classified into non-plasma and plasma types.

The non-plasma type dry etching process uses either a $ClF_3$-based gas (i.e. $ClF_3$ cleaning) or an $F_2$-based gas (i.e. $F_2$ cleaning). When a $ClF_3$-based gas is used, the dry chemical etching process is executed with an $Ar:ClF_3$ ratio of 9:1, at 100 torr, and for one minute. When the $F_2$-based gas is used, the dry chemical etching process is conducted with an $F_2$:He ratio of 3:97, at 1,000 sccm, 1.0 torr, a substrate temperature of 200° C., and for three minutes.

The plasma type dry etching process uses an $NF_3$-based gas ($NF_3$ cleaning), a $BCl_3$-based gas ($BCl_3$ cleaning), or a mixed gas of $CF_4$-based and $O_2$-based gases ($Cl_4$ cleaning). In the case of the $BCl_3$ cleaning, the dry etching process is conducted with a $BCl_3$:Ar ratio of 4:1, at 100 sccm, 0.1 torr, a high frequency output of 13.56 MHz, a substrate temperature of 200° C., and for three minutes. In the case of the $CF_4$ cleaning, the dry etching process is conducted with a $CF_4:O_2$ ratio of 8:2, at 100 sccm, 0.1 torr, a high frequency output of 13.56 MHz, a substrate temperature of 30° C., and for two minutes.

Any of the foregoing etching processes is conducted at a low temperature of 200° C. or less, so that the tungsten silicide film 3B of the bottom electrode 3F remains amorphus and free from grain boundaries, and is extensively smoothed, thereby enabling the formation of the antifuse material layer 6 on the tungsten silicide film 3B.

In a fourth step, the antifuse material layer 6 is formed on the bottom electrode 3F at least in the antifuse opening 5F. In this embodiment, the antifuse material layer 6 is formed over the inter-metal dielectric layer 4 and the bottom electrode 3F in the antifuse opening 5F. The antifuse material layer 6 is a nitride silicon film deposited by the plasma CVD method under the conditions of a substrate temperature 350° C., 1700 sccm of mono-silane ($SiH_4$), 500 sccm of ammonium ($NH_3$), 300 sccm of $N_2$, a pressure of 0.35 torr, a high frequency of 50 KHz, and high frequency output of 0.98 KW. The antifuse material layer 6 is 5–20 nm thick (10 nm thick in this embodiment). Since the antifuse material layer 6 is deposited, in the antifuse opening 5F, on the smoothed surface of the bottom electrode 3F, i.e. on the surface of the tungsten silicide film 3B which is amorphous, the antifuse material layer 6 is uniformly formed to have good quality.

The antifuse material layer 6 may be a single layer of a nitride silicon film, an oxide silicon film or an oxide tantalum film, or double or more layers of the nitride silicon film, oxide silicon film, or oxide tantalum film.

When the dry etching process for the tungsten silicide film 3B and the formation of the antifuse material layer 6 are sequentially conducted in the same vacuum system, there is little possibility that an oxide film is naturally formed on the tungsten silicide film 3B. Thus, the antifuse material layer 6 on the tungsten silicide film 3B has excellent quality.

On the other hand, when the wet chemical pre-cleaning is used, it is difficult to pre-clean and form the tungsten silicide film 3B in the same vacuum system. However, since the tungsten silicide film 3B has been chemically pre-cleaned by a mixture of ammonium and hydrogen peroxide (i.e. the APM cleaning) in this embodiment, the surface of the film 3B is etched and smoothed at the same time. Accordingly, a new oxide film mainly comprising oxide silicon is formed on the surface of the film 3B. This new film is approximately 1–2 nm thick. Since the surface of the film 3B is extensively smoothed by the pre-cleaning, the new oxide film is uniform and has excellent quality. The antifuse material layer 6 is formed on the new oxide film. The antifuse material layer 6 is substantially free from defects and assures a very good withstand voltage.

Figure 2D:
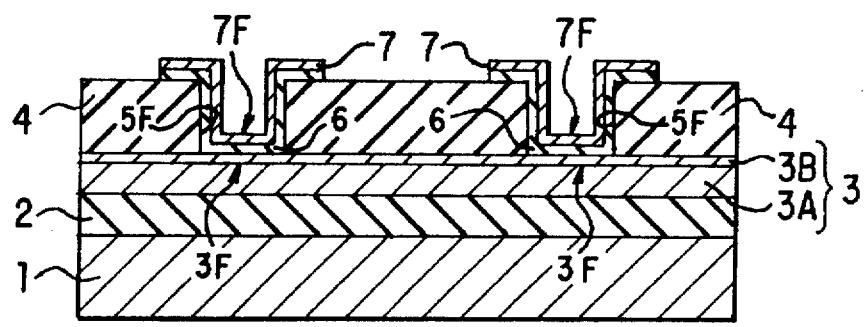

In a fifth step, the top electrode 7F is formed on the entire surface of the antifuse material layer 6. As shown in FIG. 2(D), the top electrode 7F and the antifuse material layer 6 are patterned as predetermined. Both the top electrode 7F and the antifuse material layer 6 may be formed at least in a part of the antifuse opening 5F. The patterning is conducted using photolithography and etching techniques.

In this embodiment, the top electrode 7F is made from a conductive material containing a fusible metal, e.g. Al alloy such as an alloy of Al-Cu, Al-Si or Al-Cu-Si. The Al alloy is obtained by sputtering Al on an alloy target. The Al alloy film is approximately 20 nm thick. Since the top electrode 7F is made from the Al alloy containing a fusible metal as an additive, the filament 10 which is formed during programming or data writing receives Al with the additive. Thus, the filament 10 is slow to break down.

Figure 3A:
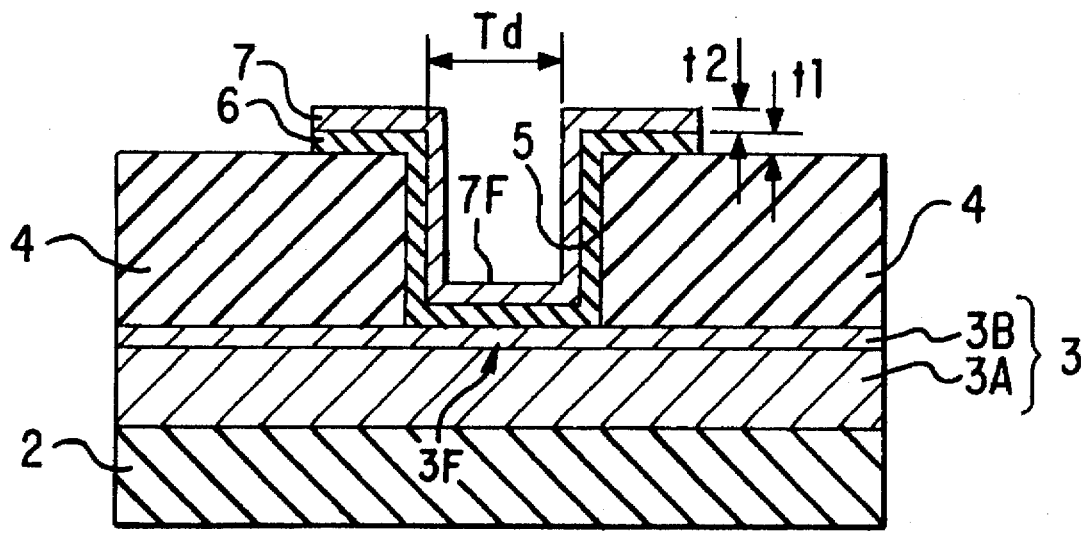
FIGS. 3A and 3B are enlarged cross-sectional views showing a main part of the antifuse element.

Referring to FIG. 3A, when the antifuse material layer 6 has a thickness t1, and the top electrode 7F has a thickness t2, the thickness t1 is equal to or less than the thickness t2 (t1≦t2). If the top electrode 7F is thick enough, a sufficient amount of a fusible metal such as Al can be supplied by breaking the top electrode 7F so as to form the filament 10 at the time of programming or data writing. In other words, the resistance of the filament 10 itself can be reduced extensively.

The third level metal interconnect 8 on the top electrode 7F has a thickness t3 which is larger than the thickness t2 of the top electrode 7F (i.e. t3>t2). In this case, the lower surface of the third level metal interconnect 8 (i.e. the surface of the inter-metal dielectric layer 4 which is roughened by the antifuse material layer 6 and the top electrode 7F) can be substantially smoothed and flattened. Assuming that the antifuse material layer 6 is 10–20 nm thick, the top electrode 7F is 20 nm thick, and the third level metal interconnect 8 is 800–1,000 nm thick, a difference of height between the antifuse material layer 6 and the top electrode 7F is approximately 30–40 nm. This difference is approximately one-fortieth or one-fiftieth of the thickness of the third level metal interconnect 8. Therefore, the third level metal interconnect 8 is substantially flat, so that it can be precisely etched and patterned by the lithography and etching techniques.

Figure 3B:
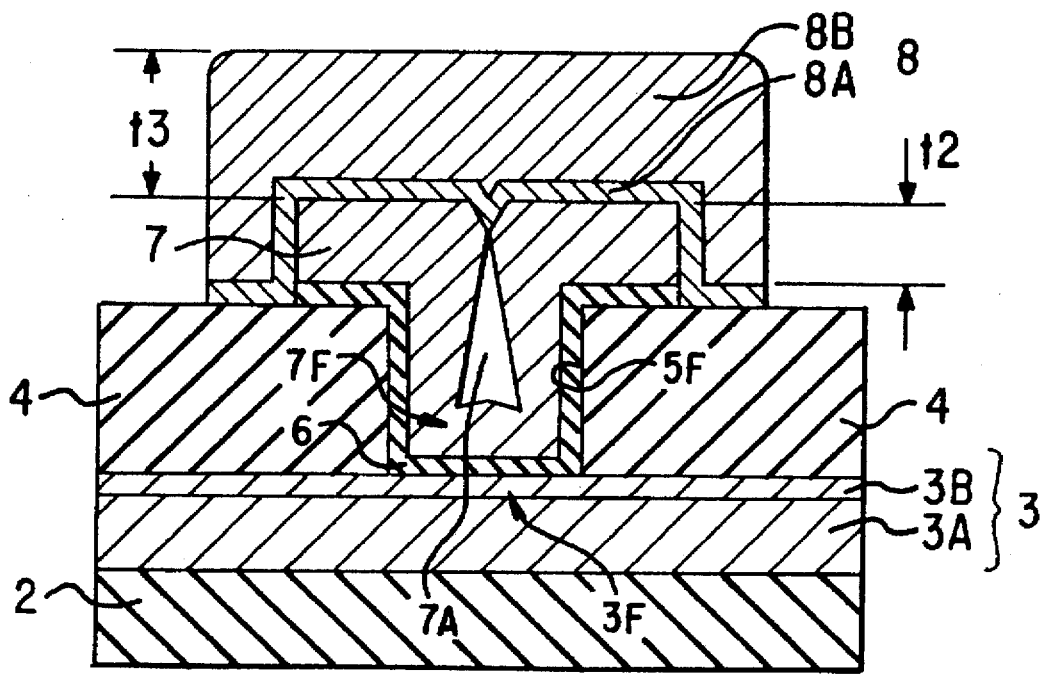

As shown in FIG. 3A, in the antifuse connecting hole 5F, the top electrode 7F has a thickness which is equal to or less than a half of Td (effective width of the antifuse opening 5F, i.e. an effective width of the antifuse opening 5F—(2×t2)). Thus, it is possible to prevent generation of a void 7A in the antifuse connecting hole 5F as shown in FIG. 3B, and occurrence of poor conduction, thereby assuring reliable electrical connection.

Figure 2E:
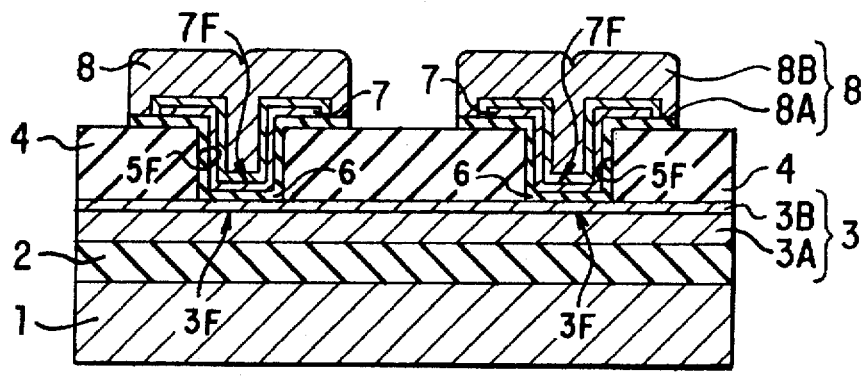

In a sixth step, the third level metal interconnect 8 is formed over the inter-metal dielectric layer 4 and the top electrode 7F as shown in FIG. 2(E). The third level metal interconnect 8 includes a nitride titanium film 8A and an aluminum alloy film 8B which are layered in this order. The nitride titanium film 8A is deposited by the reactive sputtering or CVD method, and is 100 nm thick.

The nitride titanium film 8A positioned on the top electrode 7F serves to prevent the top electrode 7F from coming into contact with the Al alloy film 8B when the antifuse element is broken down for programming. In other words, the nitride titanium film 8A serves as a barrier for preventing Al in the Al alloy film 8B from diffusing and migrating into the antifuse material layer 6. Further, the nitride titanium film 8A assists migration of the fusible metal from the top electrode 7F into the antifuse material layer 6. When the top electrode 7F melts and bulges, the nitride titanium film 8A applies stress to the top electrode 7F, so that the fusible metal will be pushed out from the top electrode 7F and migrate into the filament 10.

The Al alloy film 8B is deposited by the sputtering or CVD method, and is 800 nm thick, for example. This aluminum alloy film 8B mainly functions to provide a current path. The nitride titanium film 8A and the aluminum alloy film 8B are deposited in this order, cut together, and thereafter patterned by the photolithography and etching techniques.

Finally, in a seventh step, the passivation layer 9 is formed as shown in FIG. 1A.

A series of the foregoing steps will produce the antifuse element for a semiconductor device. The semiconductor device having antifuse elements will be programmed by the user, or will be loaded with data.

It is preferable for the top electrode, particularly, the tungsten silicide layer 3B, to have an approximately stoichiometric composition of tungsten W or more, which is one of refractory metals having a good resistance to electron-migration. In this case, an adequate amount of tungsten can be received in the filament 10, thereby allowing the filament 10 to have a good resistance to EM.

Figure 4A:
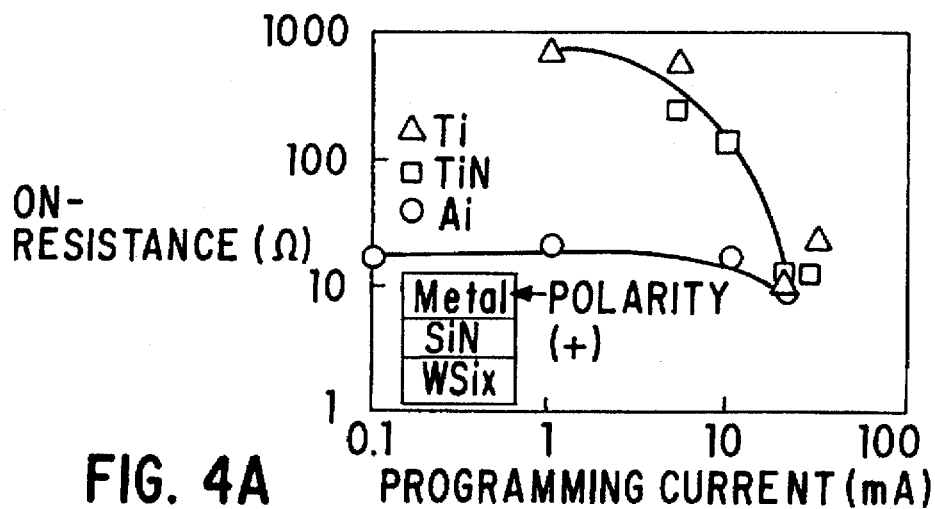
FIGS. 4A and 4B are graphs showing variation of an ON-resistance of metal layers depending upon a programming current.

The semiconductor device including the antifuse elements will be programmed by selectively applying a breakdown voltage (i.e. a programming voltage or a data-writing voltage) to at least one bottom or top electrode 3F or 7F. Then, the antifuse material layer 6 will be broken down, thereby forming a filament 10, and making the antifuse element conductive. Since the ON-resistance of the antifuse element is not sufficiently lowered in this state, a current is continuously introduced to the filament 10 so as to reduce the ON-resistance. A polarity of the breakdown voltage extensively affects the characteristics and reliability of the filament 10. Therefore, in this embodiment, a constant-current stress applying system is adopted for this purpose. In this system, a voltage is increased until a constant current flows to the antifuse element. At an initial stage, no current flows since the antifuse element remains insulated. However, when the voltage reaches the breakdown voltage, the antifuse material layer is broken down, and the flowing current becomes constant. FIG. 4A is a graph showing the relationship between an ON-resistance and a programming current. As can be seen from FIG. 4A, the top electrode 7F made from a fusible metal Al has a lower ON-resistance than a top electrode 7F made from Ti or TiN.

Figure 4B:
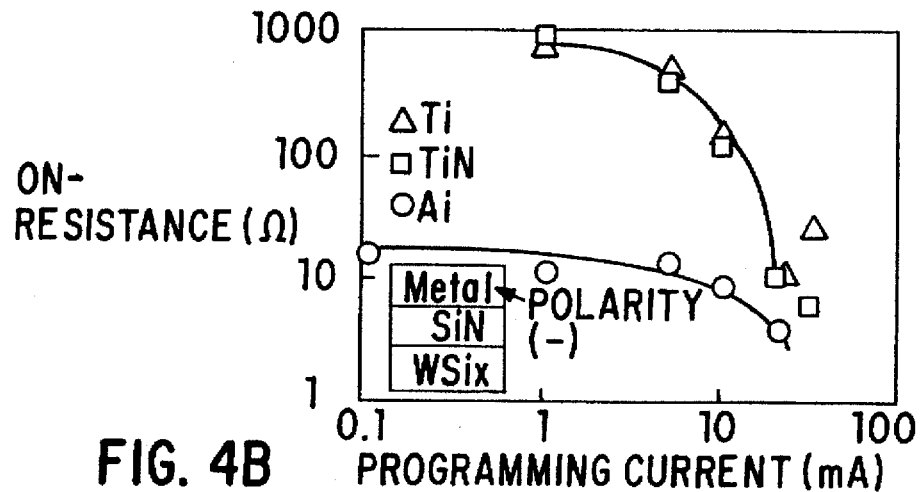

When the second level metal interconnect 7 has the negative polarity as shown in FIG. 4B, Al in the top electrode 7F electron-migrates into the filament 10, which is mainly made from Al. Thus, the ON-resistance of the filament 10 will be further lowered. The inventors fundamental research has shown that the ON-resistance is as low as 2Ω against the programming current of 20 mA as shown in FIG. 4B.

On the other hand, when the first level metal interconnect 3 is negative, tungsten W, refractory metal, in the bottom electrode 7F electron-migrates into the filament 10. However, since aluminum Al is melted by the Joule heat, a reactant containing W and Al is generated in the filament 10. In this case, the ON-resistance is relatively high compared with the foregoing case where the top electrode 7F is negative. However, the ON-resistance is substantially equal to the ON-resistance of the negative top electrode 7F when the programming current is low.

When the top electrode 7F is made from Ti or TiN, the programming current will be gradually reduced, so that the ON-resistance will be drastically increased. This tendency persists even when the polarity of the programming current is changed. On the other hand, when the top electrode 7F is made from Al, the ON-resistance remains stable even if the polarity of the programming current is changed and when the programming current is reduced.

Figure 5:
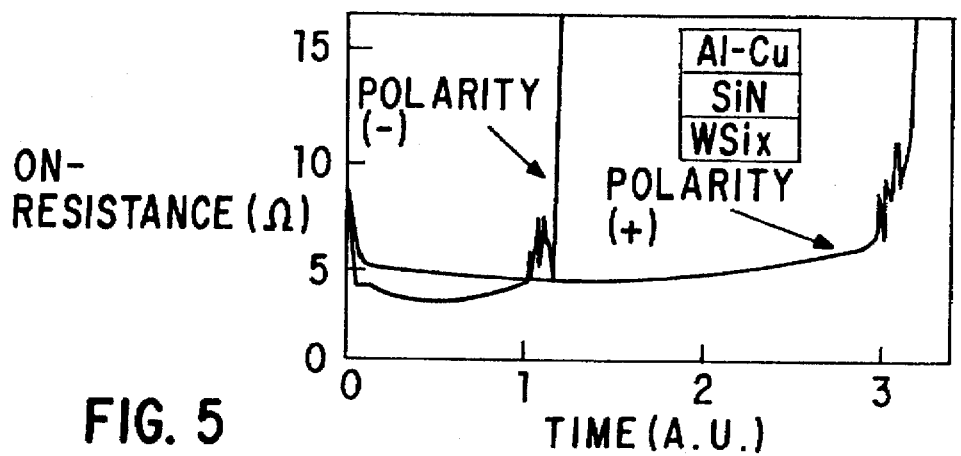
FIG. 5 is a graph showing a variation of EM resistance depending upon a polarity of programming current.

FIG. 5 shows a variation of the EM resistance of the metal interconnects. When it is negative, the bottom electrode 3F demonstrates a good EM resistance. When the top electrode 7F is negative, it has a low ON-resistance against a large programming current as described previously. When the first level metal interconnect 3 is negative, it has a relatively low ON-resistance against a small programming current and a good EM resistance.

Figure 6:
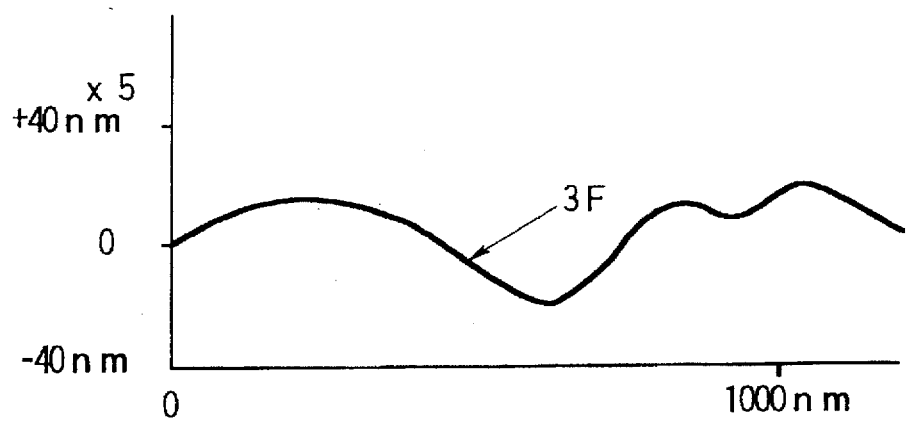
FIG. 6A is a graph showing a surface state of an antifuse material layer after the wet chemical pre-cleaning.
FIG. 6B is a graph showing a surface state of an antifuse material layer without the wet chemical pre-cleaning.
FIG. 6C is a histogram showing breakdown characteristics of an antifuse material layer after the wet chemical pre-cleaning and an antifuse material layer without the wet chemical pre-cleaning.
Figure 6:
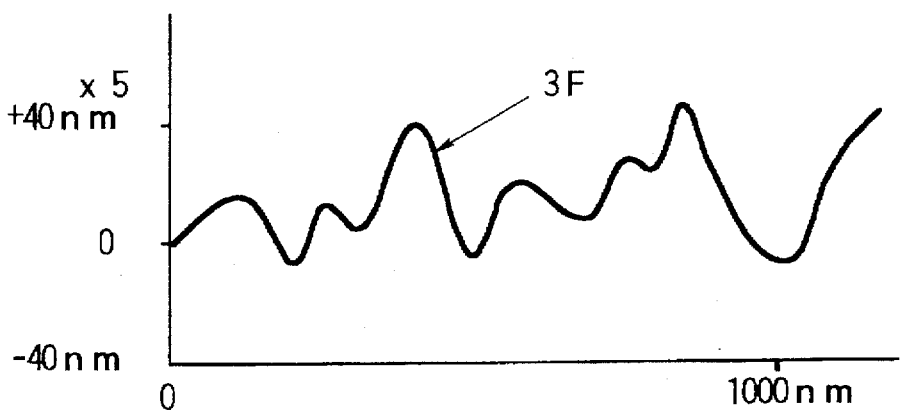
Figure 6:
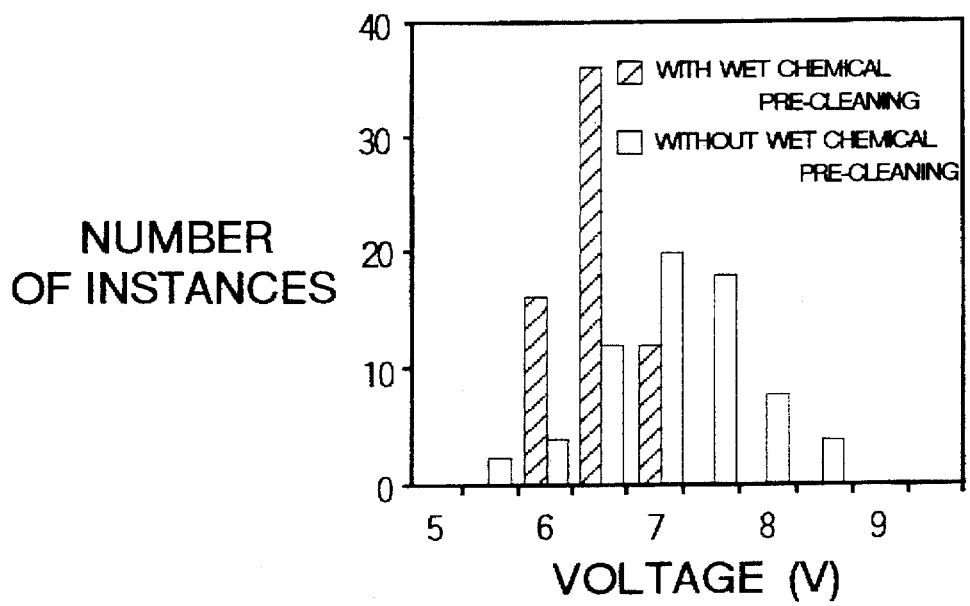

FIG. 6A shows a surface state of the bottom electrode 3F after the wet chemical pre-cleaning. FIG. 6B is a graph similar to FIG. 6A, but showing a surface state of the bottom electrode 3F without the wet chemical pre-cleaning. As can be seen from FIG. 6A, the bottom electrode 3F after the wet chemical pre-cleaning is substantially free from sharp protrusions and surface roughness, and is extensively smoothed.

FIG. 6C is a histogram showing the relationship between voltages applied to bottom electrodes 3F after the wet chemical pre-cleaning and voltages applied to bottom electrodes 3F without the wet chemical pre-cleaning. When the bottom electrode 3F undergoes the wet chemical pre-cleaning, the antifuse material layer 6 can have uniform breakdown characteristics. Conversely, if no wet chemical pre-cleaning is applied to the bottom electrode 3F, the antifuse material layer 6 tends to have poor breakdown characteristics.

In this embodiment, the bottom electrode 3F includes the amorphous tungsten silicide film 3B, so that the bottom electrode 3F is free from grain boundaries on its surface and extensively smoothed. However, if the bottom electrode 3F is not amorphous and has grain boundaries of 20 nm or less, it would have slight surface roughness. The surface of the bottom electrode 3F made from the amorphous film or a crystalline film including minute grains tends to be covered by an oxide film, which does not have uniform quality, and causes the antifuse material layer to have non-uniform breakdown characteristics. To prevent such a phenomenon, the wet chemical pre-cleaning process is applied by using ammonia hydrogen peroxide solution, so that the tungsten silicide film 3B is etched to strip off an unnecessary natural oxide film, and is covered with a good uniform oxide film. Thus, the antifuse material layer 6 can have excellent breakdown characteristics as shown in FIG. 6C when the bottom electrode 3F undergoes the wet chemical pre-cleaning. If no wet chemical pre-cleaning is performed, the antifuse element cannot assure uniform quality and reliable long life due to the presence of the unnecessary natural oxide film.

In this embodiment, the uppermost layer of the bottom electrode 3F is the tungsten silicide film 3B. This invention is not limited to such a tungsten silicide film 3B. Alternatively, the uppermost layer may be made from any of Y, Al, Mn, Fe, Co, Ni, Pd, and Pt as well as Ti, Zr, Hf, V, Nb, Ta, Cr, Mo and W. Further, a compound of Si with Y, Al, Mn, Fe, Co, Ni, Pd or Pt may be also used. Further, the bottom electrode 3F may be made from a single layer of any of the foregoing metals, or a single layer of the foregoing compound. The nitride titanium film 8A of the third level metal interconnect may be replaced with a film made from any of the foregoing metals or compounds.

A second embodiment of the invention will be described hereinafter. The second embodiment differs from the first embodiment in that an antifuse element includes a bottom electrode whose uppermost layer is made from a conductive and crystalline material.

Figure 7:
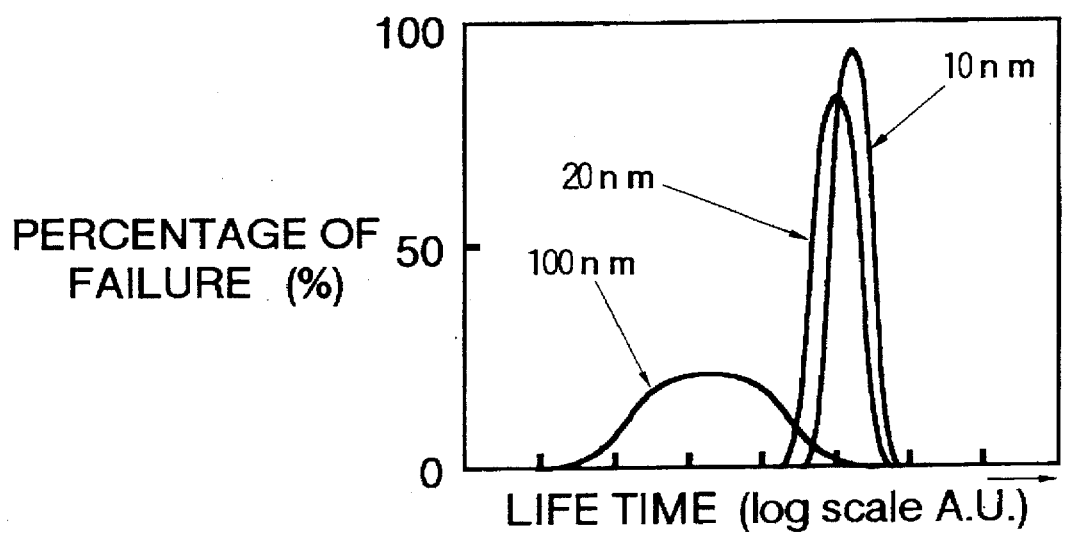
FIGS. 7A and 7B are graphs showing lifetime of unprogrammed antifuse material layers depending upon a size of crystal grains on the surface of a bottom electrode.
Figure 7:
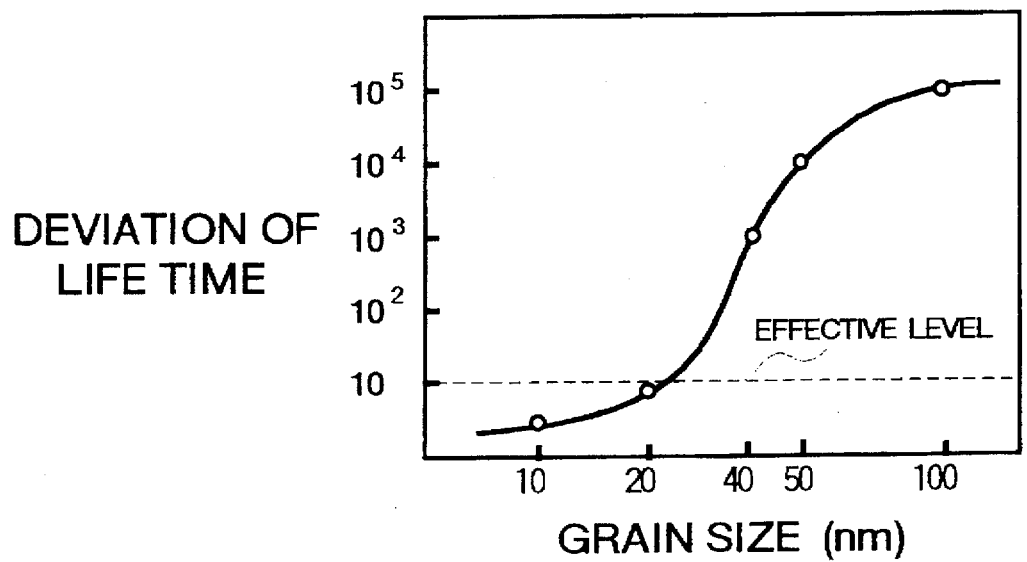

The lifetime of unprogrammed antifuse elements was tested by applying various voltages to antifuse material layers thereof. FIGS. 7A and 7B are graphs showing the lifetime of such antifuse material layers depending upon grain sizes of the bottom electrodes 3F (i.e. length of time until the antifuse material layers break down). In FIG. 7A, the abscissa denotes the length of time for the antifuse material layer to break down (i.e. lifetime), and the ordinate denotes the failure (%) of antifuse material layers.

As can be seen from FIG. 7A, when the grain size of the bottom electrode 3F is 100 nm, the failure (%) of antifuse material layers 6 is relatively small, but the life of the antifuse material layers is extensively variable. On the other hand, as the grain size becomes smaller, e.g. 20 nm and 10 nm, the antifuse material layers are durable for a relatively long period of time, but more antifuse material layers 6 are broken down at a certain time point.

In FIG. 7B, the abscissa denotes grain sizes of bottom electrodes 3F, and the ordinate denotes the deviation of lifetime of the antifuse material layers 6. It can be seen from FIG. 7B that the grain size should be 20 nm at maximum so as to maintain the lifetime of the antifuse material layers at a practical effective level. In other words, the bottom electrode 3F having the grain size of 20 nm or less on the surface thereof will have reduced roughness and become smooth on its surface. Therefore, the antifuse material layer 6 formed on the bottom electrode 3F will be substantially free from defects and have excellent quality.

Figure 8:
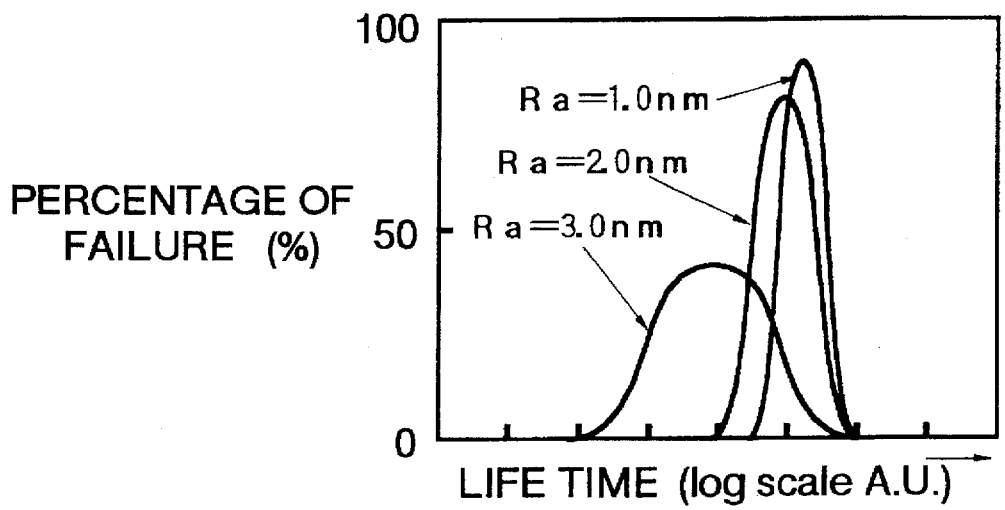
FIGS. 8A and 8B are graphs showing lifetime of antifuse material layers depending upon a center line average height of the bottom electrode.
Figure 8:
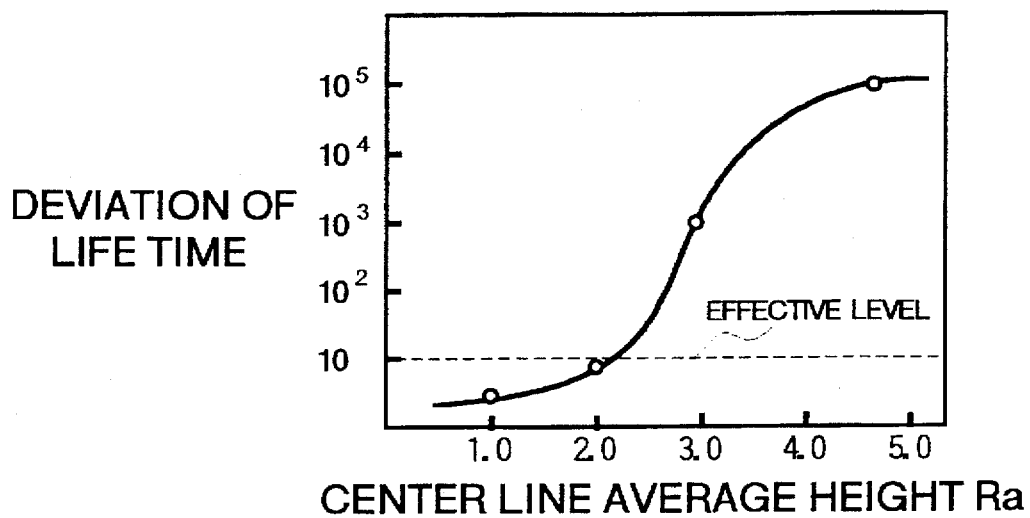

FIGS. 8A and 8B show the lifetime of the antifuse material layers depending upon center line average height of the bottom electrodes 3F. As can be seen from FIG. 8A, when the center line average height Ra is 3.0, a percent of broken-down antifuse material layers is low, but the lifetime of the antifuse material layers varies extensively. The smaller Ra, i.e. 2.0 nm and 1.0 nm, the less variable the lifetime of the antifuse material layers, but the failure (%) of antifuse material layers becomes large.

Referring to FIG. 8B, it can be seen that the center line average height Ra should be set below 2.0 nm so as to maintain the variation of life below the practical level. When the bottom electrode 3F has the center line average height Ra of 2.0 nm or less, it is substantially free from sharp protrusions and is extensively smoothed, Thus, the antifuse material layer 6 on the bottom electrode 3F will be relatively free from defects and have a good quality.

Figure 9:
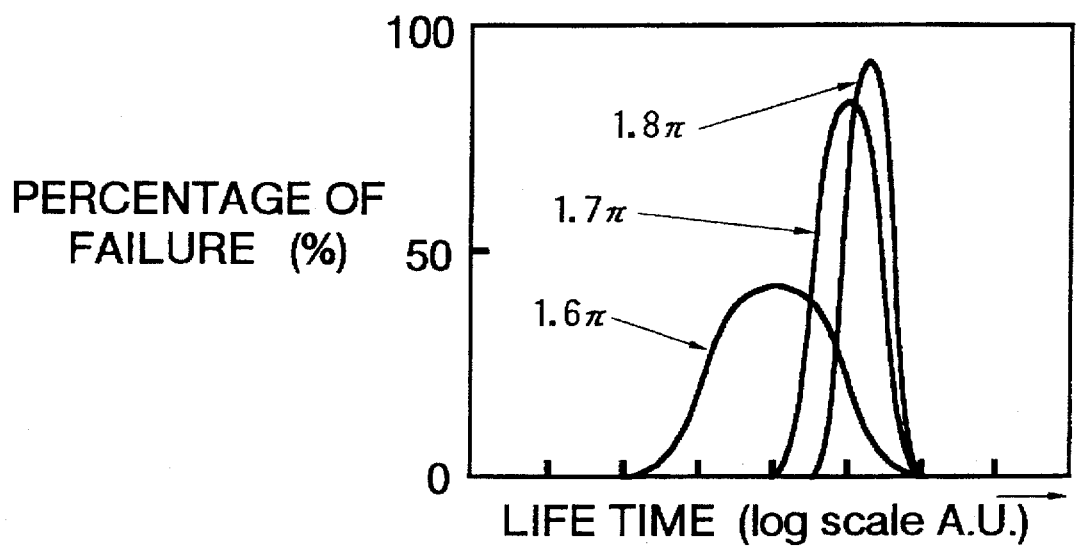
FIGS. 9A and 9B are graphs showing lifetime of antifuse material layers depending upon solid angles of crystal grains.
Figure 9:
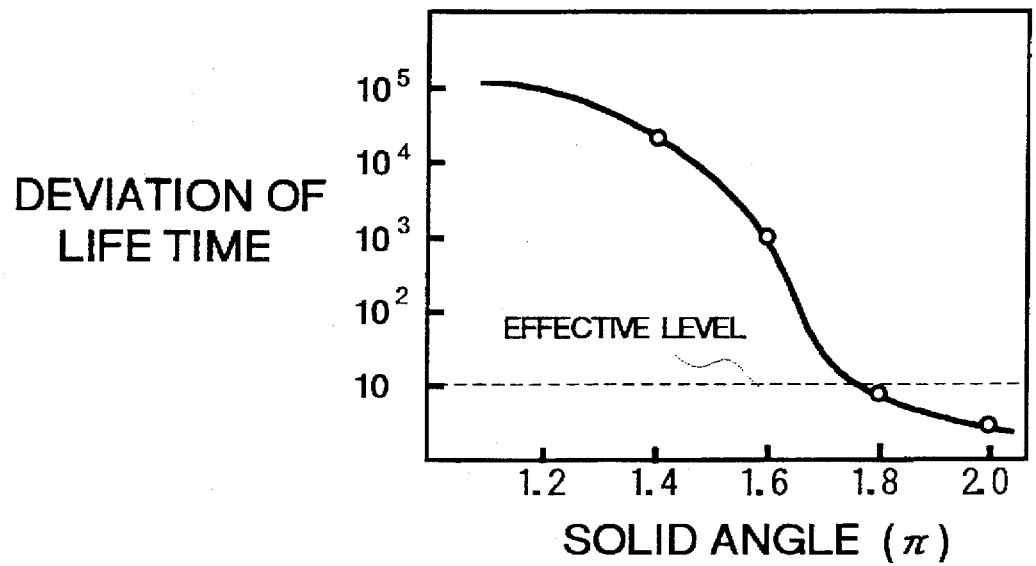

FIGS. 9A and 9B are graphs showing the lifetime of unprogrammed antifuse material layers depending upon solid angles of crystal grains on the surface of the bottom electrode 3F. In FIG. 9A, the abscissa denotes the failure (%) of antifuse material layers, and the ordinate denotes life of the antifuse material layers. As can be seen from FIG. 9A, the antifuse material layers, on the bottom electrode 3F whose grain size is between 1 nm and 1 μm in diameter and whose solid angle is $1.6\pi$, have a low faliure percent, but they have a very variable lifetime.

FIG. 9B shows that the solid angle of the grains should be set to be $1.8\pi$ or more so as to maintain the lifetime of the antifuse material layers at the practical level. By the way, a solid angle of $2.0\pi$ represents that the surface is flat. In other words, when the solid angle of the crystal grains on the surface of the bottom electrode 3F is $1.8\pi$ or more, the bottom electrode 3F is substantially free from sharp protrusions and is smoothed. Thus, the antifuse material layer 6 is substantially free from defects and very uniform and smooth.

The preceding description is meant to be illustrative only but not limiting. Various alternatives, modifications and equivalents may be used.

For example, the present invention is applicable to an antifuse element in which the top electrode may be fabricated together with the first level metal interconnect 3 in the same fabrication step, the bottom electrode which is under the first level metal interconnect 3 is fabricated with a gate electrode of MISFET in the same fabrication step, and an antifuse material layer is formed between the bottom and top electrodes.

The present invention is also applicable to a semiconductor device including four or more level metal interconnects.

Further, the present invention is applicable to printed circuit boards including antifuse elements, and metal interconnect making techniques.

The present invention is advantageous in that it is possible to reduce a resistance of a filament and improve the EM resistance thereof in an integrated semiconductor device.

Finally, the present invention is effective to accelerate the operation speed and long effective life of the integrated semiconductor device.

What is claimed is:

1. An antifuse element in an integrated circuit device, said integrated circuit device formed within and on a substrate, said antifuse element capable of assuming a programmed state and an unprogrammed state and comprising:
   a bottom electrode including at least an uppermost layer thereof made from a conductive material containing a refractory metal;

a top electrode including at least a lowermost layer thereof made from a conductive material containing a fusible metal;

an antifuse material layer sandwiched between said bottom and top electrodes; and a barrier layer disposed between said top electrode and a metal interconnect layer over said top electrode, said barrier layer preventing diffusion of said fusible metal.

2. The antifuse element as in claim 1, wherein said fusible metal is made from one of the following: Al, an aluminum alloy, Cu and Ag, wherein the aluminum alloy contains at least one member selected from the group consisting of Si, Cu, Sc, Pd, Ti, Ta and Nb.

3. The antifuse element as in claim 2, wherein said barrier layer is made from one of the following: at least one member selected from the group consisting of Ti, Ta, Zr, Hf, V, Nb, Mo, W and Pt; at least one member selected from the group consisting of nitride of Ti, Ta, Zr, Hf, V, Nb, Mo, W and Pt; at least one member selected from the group consisting of silicide of Ti, Ta, Zr, Hf, V, Nb, Mo, W and Pt; and TiW.

4. The antifuse element as in claim 1, wherein said antifuse material layer has a thickness of 5 nm to 20 nm.

5. The antifuse element as in claim 1, wherein one of said bottom electrode and at least an uppermost layer of said bottom electrode is made from a conductive material comprising at least one member selected from the group consisting of Ti, Zr, Hf, V, Nb, Ta, Cr, Mo and W.

6. The antifuse element as in claim 5, wherein said bottom electrode or at least said uppermost layer of said bottom electrode is made from amorphous material or crystalline material having a grain size of 20 nm or less.

7. The antifuse element as in claim 5, wherein one of said bottom electrode and at least said uppermost layer is made from a silicide formed by the combination of Si with at least one member selected from the group consisting of Ti, Zr, Hf, V, Nb, Ta, Cr, Mo and W.

8. The antifuse element as in claim 4, wherein a programmed antifuse element includes a filament made from one of Al and an Al compound containing at least one member selected from the group consisting of Ti, Zr, Hf, V, Nb, Ta, Cr, Mo and W.

9. The antifuse element as in claim 8, wherein said compound constituting said filament contains at least one member selected from the group consisting of $TiAl_3$, $ZrAl_3$, $HfAl_3$, $VAl_3$, $NbAl_3$, $TaAl_3$, $CrAl_7$, $CrAl_3$, $MoAl_{12}$, and $WAl_{12}$.

10. The antifuse element as in claim 1, wherein said bottom electrode is adapted to receiving a positive potential, and said top electrode is adapted to receive a negative potential so as to form a filament containing a fusible metal from one of said top electrode and a lowermost layer of said top electrode.

11. The antifuse element as in claim 1, wherein said bottom electrode is adapted to receive a negative potential, and said top electrode is adapted to receive a positive potential so as to form a filament containing a fusible metal from one of said top electrode and a lowermost layer of said top electrode and a refractory metal from one of said bottom electrode and an uppermost layer of said bottom electrode.

12. The antifuse element as in claim 1, wherein said bottom electrode is adapted to receive a negative potential, and said top electrode is adapted to receive a positive potential so as to form a filament containing a refractory metal from said one of bottom electrode and an uppermost layer of said bottom electrode.

13. The antifuse element as in claim 1, further comprising a thin silicon oxide film layer formed between the bottom electrode and the antifuse material layer.

14. A semiconductor device including at least one antifuse element capable of assuming a programmed state and an unprogrammed state the antifuse element comprising:

a bottom electrode including at least an uppermost layer thereof made from a conductive material containing a refractory metal;

a top electrode including at least a lowermost layer thereof made from a conductive material containing a fusible metal;

an antifuse material layer sandwiched between said bottom and top electrodes; and a barrier layer disposed between said top electrode and a metal interconnect layer over said top electrode, said barrier layer preventing diffusion of said fusible metal.

15. The antifuse element as in claim 5, wherein one of said bottom electrode and at least an uppermost layer of said bottom electrode is made from metal silicide.

16. The antifuse element as in claim 15, wherein one of said bottom electrode and at least said uppermost layer of said bottom electrode is made from metal silicide that is WSi and has a thickness of 50 nm to 200 nm.

17. The antifuse element as in claim 16, wherein said metallic silicide has an amorphous structure or a polycrystal structure with a grain size of 20 nm or less.

18. The antifuse element as in claim 2, wherein said antifuse material layer has a thickness of 5 nm to 20 nm.

19. The antifuse element as in claim 3, wherein said antifuse material layer has a thickness of 5 nm to 20 nm.

20. The antifuse element as in claim 2, wherein one of said bottom electrode and at least an uppermost layer of said bottom electrode is made from a conductive material comprising at least one member selected from the group consisting of Ti, Zr, Hf, V, Nb, Ta, Cr, Mo and W.

21. The antifuse element as in claim 3, wherein one of said bottom electrode and at least an uppermost layer of said bottom electrode is made from a conductive material comprising at least one member selected from the group consisting of Ti, Zr, Hf, V, Nb, Ta, Cr, Mo and W.

22. The antifuse element as in claim 1, wherein said antifuse material layer is one of the following: a single layer of a silicon oxide film, a silicon nitride film or a tantalum oxide film, or multiple layers comprising at least two members selected from a silicon oxide film, a silicon nitride film and a tantalum oxide film.

* * * * *

UNITED STATES PATENT AND TRADEMARK OFFICE
CERTIFICATE OF CORRECTION

PATENT NO. : 5,679,974
DATED : October 21, 1997
INVENTOR(S) : Hiroshi SHINRIKI; Yoshimitsu TAMURA; and Tomohiro OHTA It is certified that error appears in the above-indentified patent and that said Letters Patent is hereby corrected as shown below:

On the front cover, in item [56] References Cited, after "U.S. Patent Documents", please add the following:

--5,166,556   11/1992   HSU et al.--
--5,404,029   04/1995   HUSHER et al.--; and after "Other Publications", please add the following:

--"A Flat-Aluminum Based Voltage-Programmable Link for Field-Programmable Devices," IEEE TRANSACTIONS ON ELECTRON DEVICES, Vol. 41, No. 5, May 1994.--

--"A Novel Double-Metal Structure for Voltage-Programmable Links," IEEE ELECTRON DEVICE LETTERS, Vol. 13, No. 9, September 1992.--

Signed and Sealed this

Seventeenth Day of February, 1998

Attest:

BRUCE LEHMAN

Attesting Officer

Commissioner of Patents and Trademarks